United States Patent [19]

Schaller et al.

[11] Patent Number: 5,015,801
[45] Date of Patent: May 14, 1991

[54] ELECTRICAL CIRCUIT MODULE

[75] Inventors: Werner Schaller, Lampertheim; Manfred Dürr, Blieskastel, both of Fed. Rep. of Germany

[73] Assignee: Schaller-Automation, Industrielle Automationstechnik KG, Blieskastel, Fed. Rep. of Germany

[21] Appl. No.: 350,578

[22] Filed: May 11, 1989

[30] Foreign Application Priority Data

May 11, 1988 [DE] Fed. Rep. of Germany ....... 3816112

[51] Int. Cl.⁵ .................. H05K 5/00; H01C 10/10
[52] U.S. Cl. .................. 174/52.2; 338/119; 338/196
[58] Field of Search ............... 338/196, 193, 164, 135, 338/116, 124, 220, 119; 174/52.2

[56] References Cited

U.S. PATENT DOCUMENTS

| 3,541,478 | 11/1970 | Peterson et al. | 174/52.2 X |
| 4,144,402 | 3/1979 | Klug et al. | 174/52.2 |
| 4,292,590 | 9/1981 | Wilson | 174/52.2 X |
| 4,674,820 | 6/1987 | Foster et al. | 174/52.2 X |

Primary Examiner—Bruce A. Reynolds
Assistant Examiner—Marvin M. Lateef
Attorney, Agent, or Firm—Kenyon & Kenyon

[57] ABSTRACT

An electrical circuit module in which structural elements of the circuit module are foamed or cast over with synthetic resin. At least one component is located in the interior of the resin and has an actuating shaft allowing adjustment of the component. An extension shaft that is rotationally symmetrical and has a driver is coupled to the actuating shaft. The extension shaft has a rotation-symmetrical bead and is embedded in the synthetic resin in a positive-fitting manner. The extension shaft also has an adjustment and protruding to the outside of the resin, and a surface which forms a separation layer toward the resin.

7 Claims, 3 Drawing Sheets

ELECTRICAL CIRCUIT MODULE

FIELD OF THE INVENTION

The present invention relates to an electrical circuit module having structure and connection elements that are foamed or cast over with synthetic resin. At least one component of the circuit module is located in the interior of the synthetic resin and can be adjusted during operation. An example of such a component is a potentiometer, where its operating shaft is accessible from the outside by an operating tool, for instance, a screwdriver.

BACKGROUND OF THE INVENTION

A known circuit module has a potentiometer that is adjustable from the outside. A tube is inserted before the enclosure with synthetic resin of the axial extension of the operating shaft to provide access to the slotted operating shaft with a screwdriver for adjustment. Thus, this operating shaft remains accessible from the outside. When this tube is enclosed, penetration of synthetic resin into the interior of the tube that blocks access to the operating shaft is frequently unavoidable. A reliable seal between the component and the tube is difficult especially with low-viscosity synthetic resins and foaming. In addition, such an access tube must be protected against clogging by contamination or the like from the outside. Inserting a screwdriver through the thin tube into the slot of the actuating shaft from the adjustable component is likewise difficult and is possible only with a special screwdriver.

There is a need to provide a circuit module having simplified access to the adjustable component's inner actuating shaft, as well as providing contamination protection of the adjustable component and the facilitation of operation of the actuating shaft from the outside.

SUMMARY OF THE INVENTION

These and other needs are met by the present invention which provides an electrical circuit module in which structural elements of the circuit module are foamed or cast over with synthetic resin. At least one component is located in the interior of the resin and has an actuating shaft allowing adjustment of the component. An extension shaft that is rotationally symmetrical and has a driver is coupled to the actuating shaft of the component. The extension shaft has a rotation-symmetrical bead or constriction and is embedded in the synthetic resin in a positive-fitting manner. The extension shaft also has an adjustment end protruding to the outside of the resin, and a surface which forms a separation layer toward the resin.

In the present invention, an extension shaft with rotational symmetry and provided with a driver is placed on the actuating shaft of the adjustable component and is surrounded by synthetic resin during the foaming or casting process and remains there. This extension shaft thereby forms the shaped body for access to the actuating shaft, and at the same time, replaces the special actuating tool. Since the extension shaft remains in the synthetic resin, a seal against penetration of synthetic resin is unnecessary. The positive fit against pulling out of the extension shaft is obtained here in a very simple manner by the circular rotation-symmetrical bead or constriction. The extension shaft is provided with a surface forming a separation layer toward the synthetic resin, so that the extension shaft remains rotatable in spite of the embedment of the synthetic resin. The end of this extension shaft that freely protrudes to the outside can be an actuating element itself or can be provided with guides for placing an actuating tool.

If the separation layer is formed by a specially smoothed surface of the extension shaft, sticking of the extension shaft to the synthetic resin is avoided in a simple manner. This specially smoothed surface can be obtained at low cost by injection molding of the extension shaft of thermoplastic resin and polishing the injection tool.

If the separation layer is formed by application of a separating agent to the extension shaft by immersion or injection molding before enclosing the extension shaft with synthetic resin, then the extension shaft with a rough surface remains rotatable in the synthetic resin. The rough surface is made, for instance, by chip removal processes. If a separating agent is used which remains permanently elastic, this separating agent also performs a sealing and lubricating function.

In order to prevent a displacement of the adjustable component by an unintentional rotation of the extension shaft, for instance, due to vibration, the surface of the extension shaft can be provided with a finely knurled surface. With suitable elasticity of the enclosing synthetic resin, the extension shaft jumps when it rotates, always into the next groove position by overcoming the groove resistance into the next groove position and thereby forms a detent of the extension shaft.

In order to make possible easy operation of the adjustable component from the outside of the resin, the outward-protruding adjustment end of the extension shaft is provided with a slot, or an internal or external hexagon for receiving either an operating tool or a manual rotating knob.

At the adjusting end of the extension shaft, an adjusting scale for the adjustable component is provided in an embodiment of the present invention. This allows a desired value to be set directly from the outside.

In prior circuit modules having an operation indicator, the signal lamps protruded from the synthetic resin enclosure. In order to place the signal lamps in the interior on the circuit carrier and conduct the signal light to the outside without additional parts, in an embodiment of the present invention, the extension shaft is made of light-conducting material. The signal lamp makes contact with the extension shaft. Thereby, the signal light is made visible from the outside in a simple manner.

BRIEF DESCRIPTION OF THE DRAWINGS

FIG. 4b is a top view of the scale according to FIG. 4a.

DETAILED DESCRIPTION

Figure 1:
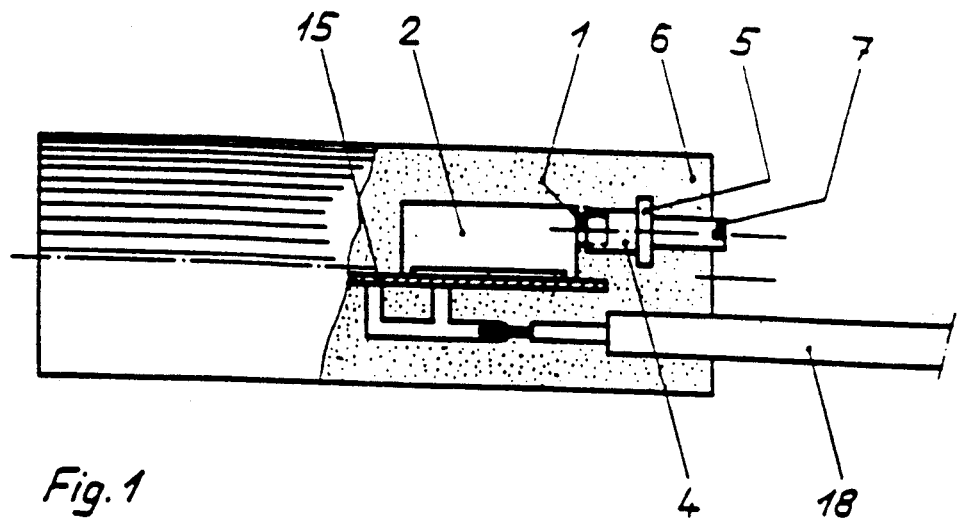
FIG. 1 shows a circuit module in a partial sectional view with an adjustable component and foamed-in extension shaft.

In FIG. 1, a cylindrical sensor designed as a foam body, is shown in a partially sectioned longitudinal view and is referred to as a circuit module. A circuit board 15 is located in the interior having a spindle potentiometer 2 that is soldered to the circuit board 15. The potentiometer 2 has an operating shaft with an extension shaft 4. A circular rotation-symmetrical bead 5 is located on the extension shaft 4. Although not shown, the rotation-symmetrical bead could be replaced by a constriction. The supporting circuit board 15 with its components as well as the extension shaft 4 are enclosed by synthetic resin foam 6. The adjusting end 7 of the extension shaft 4 extends at the rear end face of the sensor from the enclosure 6. The sensor is fed via a power supply and signal line 18 embedded in the synthetic resin and is also coupled to a signal-evaluating device located on the outside of the sensor.

Figure 2:
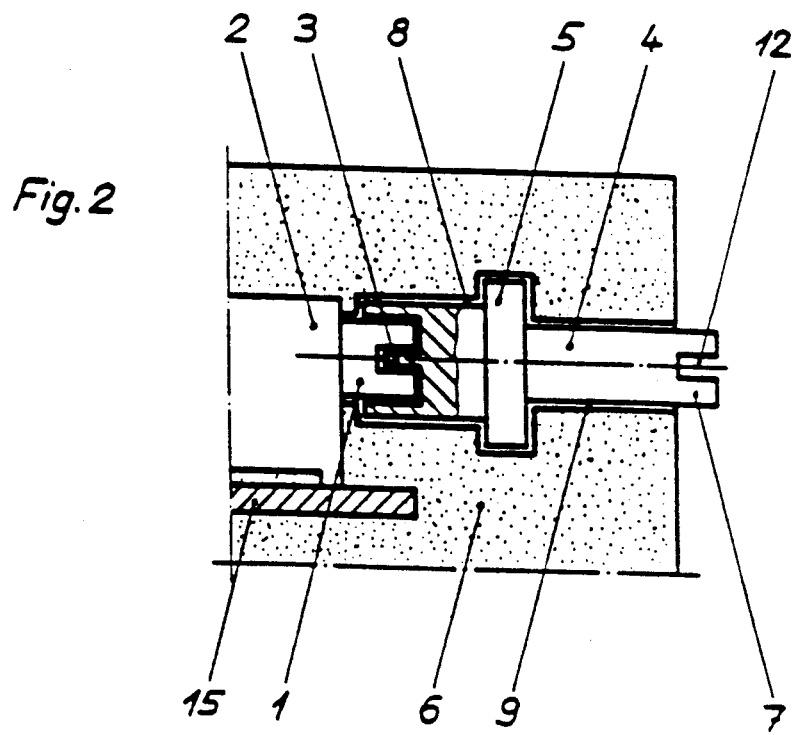
FIG. 2 is an enlarged portion of FIG. 1 with an extension shaft and a separation layer formed by a smooth surface.

FIG. 2 shows more clearly in an enlarged view a driver 3 of the extension shaft 4 engaging an operating shaft 1 of the adjustable component 2. A slot 12 receives an operating tool at the adjusting end 7 of the extension shaft 4 protruding to the outside of the sensor. A separation layer 8 at the casting resin enclosure 6 is formed by a specially smoothed surface 9 of the extension shaft 4.

Figure 3:
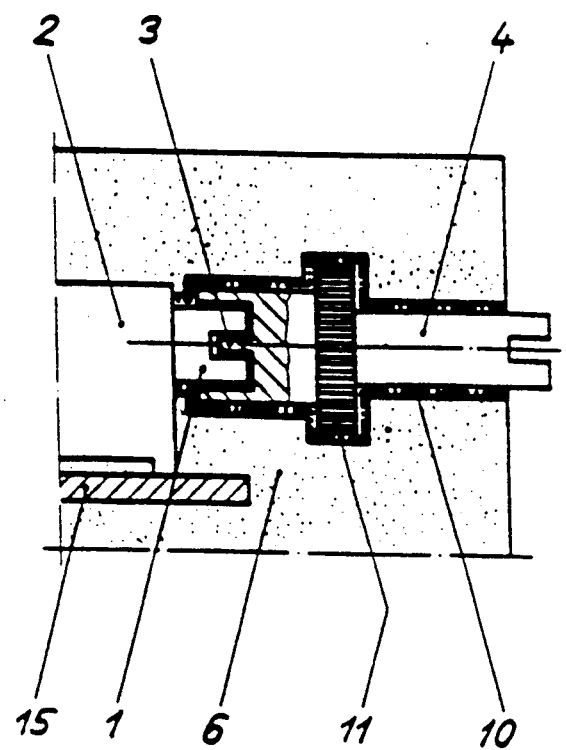
FIG. 3 is an enlarged portion of FIG. 2 with an extension shaft and a separating agent as the separation layer.

FIG. 3 shows a separating agent 10 acting as the separation layer. This separating agent 10 is applied to the extension shaft 4 before enclosure with synthetic resin 6. In addition, FIG. 3 also show an exemplary embodiment of a finely grooved surface 11 at the extension shaft 4.

Figure 4A:
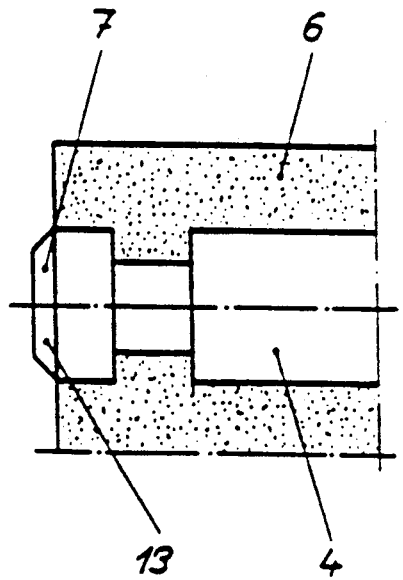
FIG. 4a illustrates a longitudinal section of an exemplary embodiment of the extension shaft with a scale.
Figure 4B:
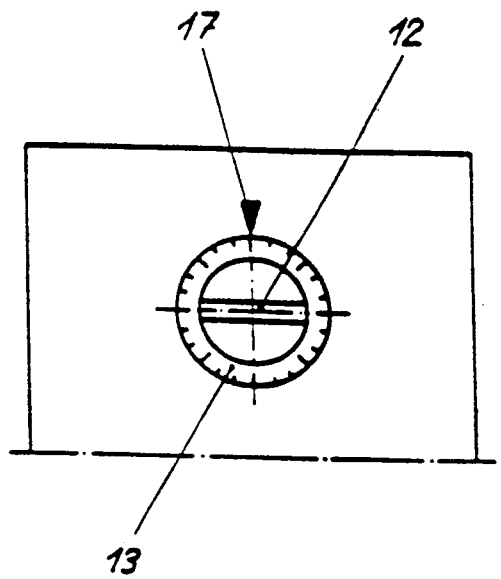

In FIGS. 4a and 4b, the outward-protruding end 7 of the extension shaft 4 is illustrated as an adjusting scale 13. A fiduciary mark 17 is applied to the outside surface of the enclosing synthetic resin. The extension shaft 4 is operated via the slot 12.

Figure 5:
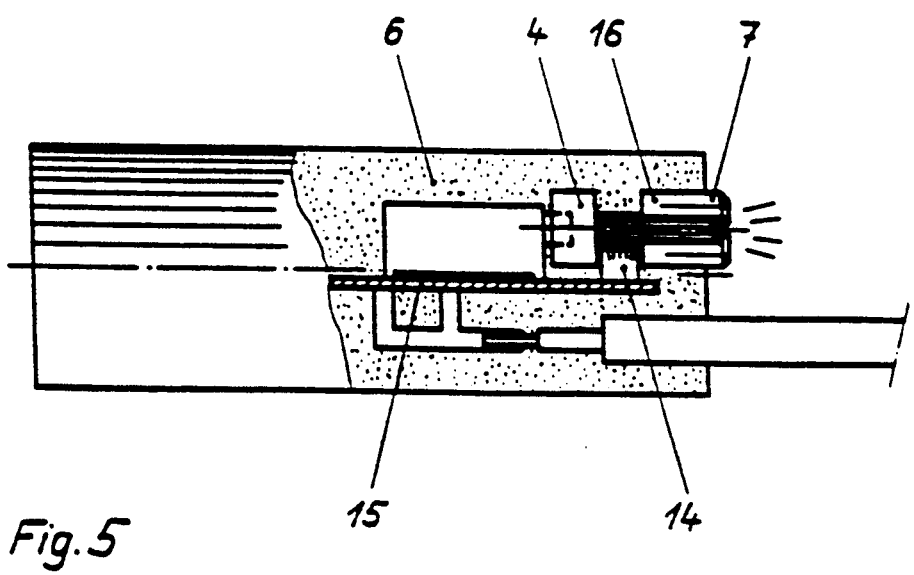
FIG. 5 shows a partial sectional view through a sensor with a light-conducting extension shaft and a signal lamp soldered into the supporting circuit board.

FIG. 5 shows a signal lamp 14 designed as an LED soldered into the circuit board 15. In this embodiment, the extension shaft 4 is formed of light-conducting material 16 and is embedded in the synthetic resin enclosure 6. The externally located adjusting end 7 of the extension shaft 4 radiates the signal light to the outside.

What is claimed:

1. An electrical circuit module in which structural elements of the circuit module are foamed or cast over with synthetic resin, comprising:
    at least one component located in the interior of the synthetic resin and adjustable during operation of the circuit module, wherein said component has an actuating shaft; and
    an extension shaft having a driver and being rotationally symmetrical, said extension shaft being coupled to said actuating shaft, wherein said extension shaft has a rotation-symmetrical bead and is embedded in the synthetic resin in a positive-fitting manner, said extension shaft having a surface which forms a separation layer toward the synthetic resin, and an adjustment end protruding to the outside of said synthetic resin.

2. The circuit module according to claim 1, wherein said separation layer between the extension shaft and the synthetic resin is formed by a specially smoothed surface of said extension shaft.

3. The circuit module according to claim 1, wherein the separation layer is a separating agent applied to the surface of the extension shaft before the extension shaft is surrounded with the synthetic resin.

4. The circuit module according to claim 1, wherein the extension shaft has a finely knurled surface having a knurling depth, said knurled surface being located in an elastic deformation region of the surrounding synthetic resin.

5. The circuit module according to claim 1, wherein the protruding adjustment end of the extension shaft has a means for receiving at least one of an operating tool and a manual control knob.

6. The circuit module according to claim 5, wherein the adjustment end includes an adjustment scale for the adjustable component.

7. The circuit module according to claim 1, further comprising at least one signal lamp which indicates operation, wherein said signal lamps are arranged on a circuit carrier within the synthetic resin, and wherein said signal lamps are arranged near the extension shaft, the extension shaft being formed of light-conducting material that conducts the signal light outward toward the adjustment end.

* * * * *